(12) United States Patent
Yamagata et al.

(10) Patent No.: US 11,266,048 B2
(45) Date of Patent: Mar. 1, 2022

(54) ELECTROMAGNETIC WAVE ABSORBER, ARTICLE WITH ELECTROMAGNETIC WAVE ABSORBER, AND METHOD FOR MANUFACTURING ELECTROMAGNETIC WAVE ABSORBER

(71) Applicant: NITTO DENKO CORPORATION, Ibaraki (JP)

(72) Inventors: Kazuto Yamagata, Osaka (JP); Hironobu Machinaga, Osaka (JP); Hiroichi Ukei, Osaka (JP); Takehiro Ui, Osaka (JP)

(73) Assignee: NITTO DENKO CORPORATION, Ibaraki (JP)

( * ) Notice: Subject to any disclaimer, the term of this patent is extended or adjusted under 35 U.S.C. 154(b) by 0 days.

(21) Appl. No.: 16/957,885

(22) PCT Filed: Dec. 28, 2018

(86) PCT No.: PCT/JP2018/048541
§ 371 (c)(1),
(2) Date: Jun. 25, 2020

(87) PCT Pub. No.: WO2019/132027
PCT Pub. Date: Jul. 4, 2019

(65) Prior Publication Data
US 2021/0059085 A1    Feb. 25, 2021

(30) Foreign Application Priority Data

Dec. 28, 2017   (JP) ............................. JP2017-253475

(51) Int. Cl.
*H05K 9/00* (2006.01)
*H01Q 17/00* (2006.01)

(52) U.S. Cl.
CPC ......... *H05K 9/0088* (2013.01); *H01Q 17/008* (2013.01)

(58) Field of Classification Search
CPC .......................... H05K 9/0088; H01Q 17/008
See application file for complete search history.

(56) References Cited

U.S. PATENT DOCUMENTS

| 5,364,685 A | 11/1994 | Nakashima et al. |
| 2012/0306712 A1* | 12/2012 | Iwanaka ............... H01Q 17/001 343/781 P |

(Continued)

FOREIGN PATENT DOCUMENTS

| EP | 1647172 A2 | 4/2006 |
| JP | 5-42623 A | 2/1993 |

(Continued)

OTHER PUBLICATIONS

International Search Report dated Mar. 26, 2019, issued in counterpart International Application No. PCT/JP2018/048541. (2 pages).

(Continued)

*Primary Examiner* — Hung V Ngo
(74) *Attorney, Agent, or Firm* — Westerman, Hattori, Daniels & Adrian, LLP

(57) ABSTRACT

An electromagnetic wave absorber (1*a*) includes a resistive layer (10), an electrically conductive layer (20) and a dielectric layer (30). The electrically conductive layer (20) has a sheet resistance lower than a sheet resistance of the resistive layer (10). The dielectric layer (30) is disposed between the resistive layer (10) and the electrically conductive layer (20). The electromagnetic wave absorber (1*a*) has a first slit (15). The first slit (15) extends, in the resistive layer (10), from a first principal surface (10*a*) distal to the dielectric layer (30) toward the dielectric layer (30) in a direction perpendicular to the first principal surface (10*a*) and divides the resistive layer (10) into a plurality of first (Continued)

blocks (17). Each of the first blocks (17) has a minimum dimension (D1) of 2 mm or more at the first principal surface (10*a*).

11 Claims, 4 Drawing Sheets

(56) References Cited

U.S. PATENT DOCUMENTS

| | | | |
|---|---|---|---|
| 2014/0098501 A1 | 4/2014 | Kawaguchi et al. | |
| 2014/0154469 A1* | 6/2014 | Kagawa | H05K 9/0088 428/155 |
| 2015/0334885 A1 | 11/2015 | Tomonari et al. | |
| 2020/0044356 A1* | 2/2020 | Mallegol | H01Q 17/00 |

FOREIGN PATENT DOCUMENTS

| | | |
|---|---|---|
| JP | 2003-198179 A | 7/2003 |
| JP | 4177143 B2 | 11/2008 |
| JP | 2011-49406 A | 3/2011 |
| JP | 4857501 B2 | 1/2012 |
| JP | 2012-99665 A | 5/2012 |
| JP | 2014-90162 A | 5/2014 |
| JP | 2015-220260 A | 12/2015 |
| JP | 2017-163141 A | 9/2017 |
| KR | 101576070 B1 | 12/2015 |
| WO | 2005/013663 A2 | 2/2005 |

OTHER PUBLICATIONS

Extended European Search Report dated Jul. 30, 2021, issued in counterpart EP Application No. 18893714.8. (11 pages).

* cited by examiner

ELECTROMAGNETIC WAVE ABSORBER, ARTICLE WITH ELECTROMAGNETIC WAVE ABSORBER, AND METHOD FOR MANUFACTURING ELECTROMAGNETIC WAVE ABSORBER

TECHNICAL FIELD

The present invention relates to an electromagnetic wave absorber, an article with an electromagnetic wave absorber, and a method for manufacturing an electromagnetic wave absorber.

BACKGROUND ART

In recent years, electromagnetic waves in a range of millimeter waves (having a wavelength of about 1 to 10 mm and a frequency of 30 to 300 GHz) and quasi-millimeter waves have been used as information communication media. Such electromagnetic waves have been used in, for example, an anti-collision system that is installed in a vehicle so as to detect obstacles to automatically put on the brakes, or measure the speed of vehicles around the vehicle equipped with the system and distance between the vehicle and another vehicle to control the speed of the vehicle and distance between the two vehicles. To allow such an anti-collision system to normally operate, reception of as few unnecessary electromagnetic waves as possible is important for prevention of false recognition. Therefore, an electromagnetic wave absorber to absorb unnecessary electromagnetic waves is usually used in such an anti-collision system.

There are various types of the electromagnetic wave absorbers classified according to their principles of electromagnetic wave absorption. It is known, for example, that an electromagnetic wave absorber (hereinafter referred to as a "$\lambda/4$ electromagnetic wave absorber") provided with an electromagnetic wave reflective layer (an electrically conductive layer), a dielectric layer having a thickness equivalent to $\lambda/4$ ($\lambda$ is a wavelength of an electromagnetic wave to be absorbed) and a resistive film layer (a resistive layer) can be produced at a low cost owing to relatively inexpensive materials and ease of design. For example, Patent Literature 1 proposes an electromagnetic wave absorber that exhibits an excellent property of functioning in a wide incident angular range as such a $\lambda/4$ electromagnetic wave absorber.

Additionally, Patent Literature 2 describes a $\lambda/4$ electromagnetic wave absorber having a flexural rigidity set to 300 MPa·mm$^4$ or less. By having a flexural rigidity set to 300 MPa·mm$^4$ or less, the electromagnetic wave absorber described in Patent Literature 2 can be attached to and along a curved face, for example.

CITATION LIST

Patent Literature

Patent Literature 1: JP 2003-198179 A
Patent Literature 2: JP 2017-163141 A

SUMMARY OF INVENTION

Technical Problem

The technique described in Patent Literature 2 makes it easy to attach the electromagnetic wave absorber to a curved face. However, the scheme to enhance the ease of attaching to an article having a curved face or the like is not limited to allowing the electromagnetic wave absorber to have a flexural rigidity of 300 MPa·mm$^4$ or less.

Therefore, the present invention provides a novel electromagnetic wave absorber that is advantageous in attaching to an article having a curved face or the like and that is advantageous in exhibiting excellent electromagnetic wave absorption performance. In addition, the present invention provides an article having the electromagnetic wave absorber, and a method for manufacturing the electromagnetic wave absorber.

Solution to Problem

The present disclosure provides an electromagnetic wave absorber including:
a resistive layer;
an electrically conductive layer having a sheet resistance lower than a sheet resistance of the resistive layer; and
a dielectric layer disposed between the resistive layer and the electrically conductive layer, wherein
the electromagnetic wave absorber has at least one of a first slit and a second slit,
the first slit extends, in the resistive layer, from a first principal surface distal to the dielectric layer toward the dielectric layer in a direction perpendicular to the first principal surface and divides the resistive layer into a plurality of first blocks,
the second slit extends, in the electrically conductive layer, from a second principal surface distal to the dielectric layer toward the dielectric layer in a direction perpendicular to the second principal surface and divides the electrically conductive layer into a plurality of second blocks,
each of the first blocks has a minimum dimension of 2 mm or more at the first principal surface, and
each of the second blocks has a minimum dimension of 1 mm or more at the second principal surface.

In addition, the present invention provides an article with an electromagnetic wave absorber, including:
an article having a curved face or a corner; and
the above-mentioned electromagnetic wave absorber that is adhered to the curved face or adhered to across the corner.

The present invention further provides a method for manufacturing an electromagnetic wave absorber, including:
providing a resistive layer;
providing an electrically conductive layer having a sheet resistance lower than a sheet resistance of the resistive layer;
disposing a dielectric layer between the resistive layer and the electrically conductive layer; and
forming at least one of a first slit and a second slit, wherein
the first slit extends, in the resistive layer, from a first principal surface distal to the dielectric layer toward the dielectric layer in a direction perpendicular to the first principal surface and divides the resistive layer into a plurality of first blocks,
the second slit extends, in the electrically conductive layer, from a second principal surface distal to the dielectric layer toward the dielectric layer in a direction perpendicular to the second principal surface and divides the electrically conductive layer into a plurality of second blocks,
each of the first blocks has a minimum dimension of 2 mm or more at the first principal surface, and
each of the second blocks has a minimum dimension of 1 mm or more at the second principal surface.

Advantageous Effects of Invention

The electromagnetic wave absorber mentioned above is advantageous in attaching to an article having a curved face or the like and that is advantageous in exhibiting excellent electromagnetic wave absorption performance.

DESCRIPTION OF EMBODIMENTS

Embodiments of the present invention will be described with reference to the drawings. The present invention is not limited to the following embodiments. In the attached drawings, the x axis, the y axis and the z axis are perpendicular to each other, and the z axis extends along a thickness direction of an electromagnetic wave absorber. Among the attached drawings, the positive direction of the x axis remains the same, the positive direction of the y axis remains the same, and the positive direction of the z axis remains the same.

Figure 1:
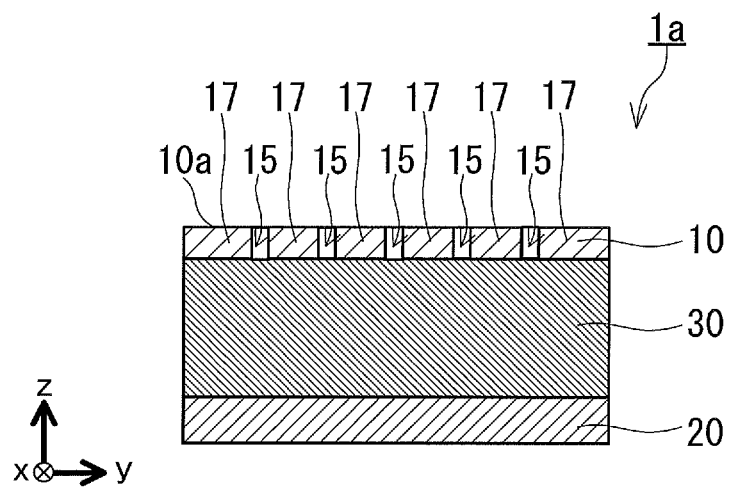
FIG. 1 is a cross-sectional view showing an example of an electromagnetic wave absorber according to the present invention.
Figure 2:
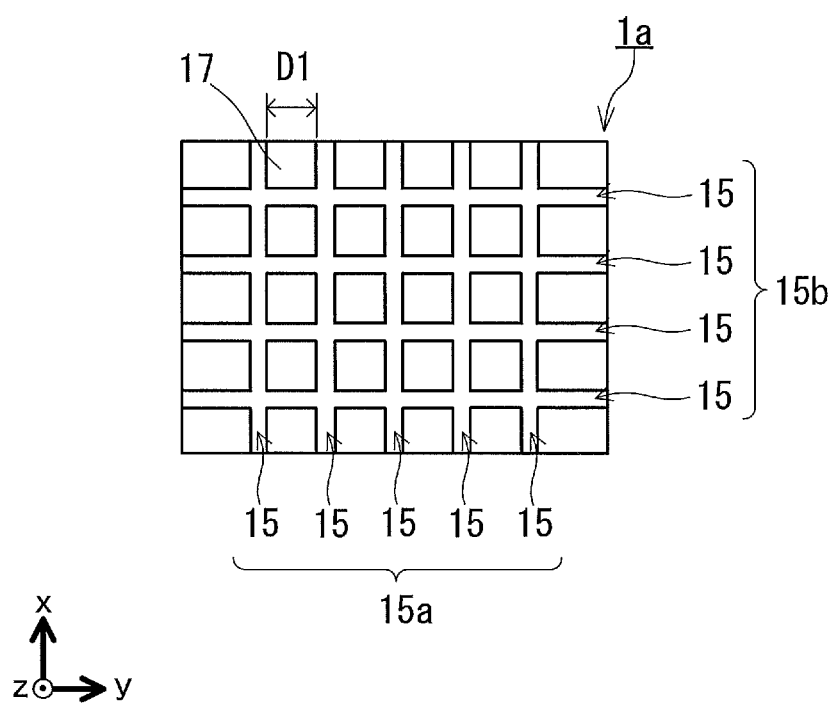
FIG. 2 is a plan view of the electromagnetic wave absorber shown in FIG. 1.

As shown in FIG. 1, an electromagnetic wave absorber 1a includes a resistive layer 10, an electrically conductive layer 20 and a dielectric layer 30. The electrically conductive layer 20 has a sheet resistance lower than a sheet resistance of the resistive layer 10. The dielectric layer 30 is disposed between the resistive layer 10 and the electrically conductive layer 20. The electromagnetic wave absorber 1a has a first slit 15. The first slit 15 extends, in the resistive layer 10, from a first principal surface 10a distal to the dielectric layer 30 toward the dielectric layer 30 in a direction perpendicular to the first principal surface 10a and divides the resistive layer 10 into a plurality of first blocks 17. As shown in FIG. 2, each of the first blocks 17 has a minimum dimension D1 of 2 mm or more at the principal surface 10a.

When the first principal surface 10a is viewed in plane, the minimum dimension D1 is typically the smaller one of the minimum value of a distance between vertexes and the shortest distance between lines that do not intersect each other in a plane figure representing an outline of the first block 17. In this case, each of the vertexes means the vertex of an angle. Each of the vertexes can be formed by straight lines intersecting each other, curves intersecting each other, or a straight line and a curve intersecting each other. On the other hand, in the case where, when the first principal surface 10a is viewed in plane, an outline of the plane figure representing the outline of the first block 17 includes a curve such as an arc and also the number of the vertexes of the plane figure is two or less, the minimum dimension D1 is a dimension in a direction in which a line passing through two points on the outline of the plane figure and the center of gravity of the plane figure has the shortest length.

Since the electromagnetic wave absorber 1a has the first slit 15, it is possible to bend the electromagnetic wave absorber 1a in such a manner that an opening of the first slit 15 is enlarged, which makes it easy to bend the electromagnetic wave absorber 1a. It is also possible to bend the electromagnetic wave absorber 1a in such a manner that the first 17 blocks adjacent to each other in the first slit 15 push each other. Therefore, it is easy to attach the electromagnetic wave absorber 1a also to an article having a curved face or the like.

The electromagnetic wave absorber 1a is a λ/4 electromagnetic wave absorber. The electromagnetic wave absorber 1a is designed so that when an electromagnetic wave having a wavelength ($\lambda_o$) to be absorbed is incident on the electromagnetic wave absorber 1a, the electromagnetic wave reflected by a surface of the resistive layer 10 (front surface reflection) will interfere with the electromagnetic wave reflected by the electrically conductive layer 20 (back surface reflection). It is conceived that the first slit 15 affects the surface reflection of the electromagnetic wave. The present inventors made intensive studies on the influence that the slit formed in the resistive layer has on the electromagnetic wave absorption performance of the electromagnetic wave absorber. As a result, they found that the electromagnetic wave absorber is likely to exhibit excellent electromagnetic wave absorption performance when each of the blocks of the resistive layer divided by the slit has a minimum dimension of 2 mm or more. Based on this new finding, the present inventors have invented the electromagnetic wave absorber according to the present invention.

The minimum dimension D1 of each of the first blocks 17 at the first principal surface 10a is desirably 4 mm or more, more desirably 6 mm or more, and even more desirably 10 mm or more. This makes it possible to further enhance the electromagnetic wave absorption performance of the electromagnetic wave absorber 1a.

The depth of the first slit 15 in a thickness direction of the electromagnetic wave absorber 1a is not particularly limited. The first slit 15 may have a bottom inside the resistive layer 10 or may extend through the resistive layer 10 in the thickness direction of the electromagnetic wave absorber 1a. In a direction parallel to the first principal surface 10a, an end of the first slit 15 may be positioned at an end of the first principal surface 10a, or may be positioned apart from the end of the first principal surface 10a. The first slit 15 may be formed so that a clearance is present between the first blocks 17 adjacent to each other, or may be formed so that the first blocks 17 adjacent to each other can be in contact with each other. Typically, the first slit 15 extends linearly in the direction parallel to the first principal surface 10a. The first slit 15 may extend curvilinearly.

When the first principal surface 10a is level, an area of the plurality of first blocks 17 at the first principal surface 10a is, for example, 90% or more, desirably 97% or more, and more desirably 99% or more of a sum of the area of the plurality of first blocks 17 and an area of an opening of the first slit 15. This allows the electromagnetic wave absorber 1a to have excellent electromagnetic wave absorption performance more reliably.

As shown in FIG. 2, the electromagnetic wave absorber 1a has a plurality of the first slits 15, for example. The plurality of the first slits 15 include a first slit group 15a, for example. The first slit group 15a is composed of a plurality of the first slits 15 parallel to each other at the first principal surface 10a. In this case, the minimum dimension D1 of each of the first blocks 17 at the first principal surface 10a is desirably 20 mm or less. In this case, it is easy to attach the electromagnetic wave absorber 1a to an article having a curved face with a large curvature.

As shown in FIG. 2, the plurality of the first slits 15 in the electromagnetic wave absorber 1a further include a second slit group 15b, for example. The second slit group 15b is composed of a plurality of the first slits 15 that are parallel to each other at the first principal surface 10a and that intersect the plurality of the first slits 15 included in the first slit group 15a. In this case, it is possible to bend the electromagnetic wave absorber 1a in a plurality of directions, and thus it is easy to attach the electromagnetic wave absorber 1a also to an article having a complex shape.

When the first principal surface 10a is viewed in plane, the plane figure representing the outline of the first block 17 may be a triangle, a quadrangle or another polygon, or a part or all of the outline may be a curvilinear figure.

In the λ/4 electromagnetic wave absorber, the wavelength ($\lambda_O$) of an electromagnetic wave to be absorbed is determined according to a thickness (t) of the dielectric layer 30 and a relative permittivity ($\varepsilon_r$) of the dielectric layer 30, as shown in the following equation (1). That is, an electromagnetic wave having a wavelength to be absorbed can be set by appropriately adjusting the material and thickness of the dielectric layer 30. In the equation (1), sqrt ($\varepsilon_r$) means a square root of the relative permittivity ($\varepsilon_r$). The material and thickness of the dielectric layer 30 are determined so that the electromagnetic wave having a frequency of 76 to 79 GHz can be absorbed effectively, for example.

$$\lambda_O = 4t \times \mathrm{sqrt}(\varepsilon_r) \qquad \text{Equation (1)}$$

The absolute value of a reflection amount measured in compliance with JIS (Japanese Industrial Standards) R 1679: 2007 when a 76.5-GHz electromagnetic wave is incident perpendicularly to the electromagnetic wave absorber 1a is, for example, 10 dB or more, and desirably 20 dB or more.

In designing the λ/4 electromagnetic wave absorber, the sheet resistance of the resistive layer is determined so that an impedance estimated on the front side of the resistive layer using a transmission theory is equal to a characteristic impedance. The sheet resistance required for the resistive layer may vary depending on the assumed degree of incidence angle of the electromagnetic waves to be incident on the λ/4 electromagnetic wave absorber.

The resistive layer 10 has a sheet resistance of 120 to 800Ω/□, for example. Even when the degree of incidence angle of the electromagnetic wave to the electromagnetic wave absorber 1a is assumed to be large, determining the sheet resistance of the resistive layer 10 to be a specific sheet resistance of 120 to 800Ω/□ allows the electromagnetic wave absorber 1a to exhibit desired absorption performance with regard to an electromagnetic wave of 76 to 79 GHz, for example.

The resistive layer 10 includes, for example, a layer (hereinafter referred to as a "functional layer") formed of: a metal oxide including at least one selected from the group consisting of indium, tin and zinc as a main component; an electrically conductive polymer; a carbon nanotube; a metal nanowire; or a metal mesh. The functional layer of the resistive layer 10 is desirably formed of indium tin oxide (ITO) in terms of the stability of the sheet resistance in the resistive layer 10 and durability of the resistive layer 10. In this case, the material forming the functional layer of the resistive layer 10 is desirably an ITO containing 20 to 40 weight % of $SnO_2$ and more desirably an ITO containing 25 to 35 weight % of $SnO_2$. An ITO containing $SnO_2$ in such a range has an extremely stable amorphous structure and can reduce variation in sheet resistance of the resistive layer 10 in a hot and humid environment. The sheet resistance of the resistive layer 10 refers to a value obtained by measuring the functional layer, for example. The "main component" as described herein refers to a component affecting the properties of a material including the component, and the content of such a component is commonly 50 weight % or more of the total weight of the material.

The functional layer of the resistive layer 10 has a thickness of, for example, 10 to 100 nm and desirably 25 to 50 nm. This makes it likely that the sheet resistance of the resistive layer 10 is stable even when the electromagnetic wave absorber 1a is affected by a time-dependent change or an environmental change.

The resistive layer 10 may further include, for example, a support supporting the functional layer. In this case, the resistive layer 10 can be produced, for example, by forming the functional layer on the support by a layer forming method such as sputtering and coating (bar coating, for example). In this case, the support also serves as an auxiliary member capable of adjusting a thickness of the functional layer with high accuracy. Examples of a material of the support of the resistive layer 10 include polyethylene terephthalate (PET), polyethylene naphthalate (PEN), polyimide (PI), an acrylic resin, polycarbonate (PC), polyolefin, polyethylene (PE), polypropylene (PP), cycloolefin polymer (COP), polyurethane, a urethane acrylic resin, cast polypropylene (CPP) and a vinylidene chloride resin. In particular, the material of the support of the resistive layer 10 is desirably PET or PI in terms of the balance among good heat-resistance, the dimensional stability, and cost. The support can be omitted from the resistive layer 10 in some cases.

In the case where the resistive layer 10 includes the support, the functional layer may constitute the first principal surface 10a or the support may constitute the first principal surface 10a in the resistive layer 10.

In the case where the resistive layer 10 includes the support, the support of the resistive layer 10 has a thickness of, for example, 10 to 150 μm, desirably 20 to 100 μm, and more desirably 30 to 80 μm. This can decrease the flexural rigidity of the resistive layer 10, and can reduce occurrence of a crease or deformation in the case where the functional layer of the resistive layer 10 is formed.

The resistive layer 10 has a Young's modulus of 0.07 to 5000 MPa, for example. This makes it easy to bend the electromagnetic wave absorber 1a.

For example, it is desirable that the sheet resistance of the electrically conductive layer 20 be as low as possible from the viewpoint of inhibiting the electromagnetic wave from passing through the electromagnetic wave absorber 1a. The electrically conductive layer 20 has a sheet resistance of, for example, 100Ω/□ or less and desirably 20Ω/□ or less.

The electrically conductive layer 20 includes, for example, a metal. This allows the electrically conductive layer 20 to have a low sheet resistance. It should be noted that alloys are included in metals herein. Examples of the metal included in the electrically conductive layer 20 include copper, nickel, zinc, their alloys, aluminum, gold, and stainless steel.

The electrically conductive layer 20 may include a metal foil, for example. The electrically conductive layer 20 may be formed of a single metal foil. In this case, the metal foil has a thickness of, for example, 0.1 to 100 μm, and desirably 0.1 to 50 μm. This makes it possible to inhibit the electromagnetic wave from passing through the electromagnetic wave absorber 1a more reliably, and also makes it easy to attach the electromagnetic wave absorber 1a to an article having a curved face or the like. Examples of the metal foil include aluminum foil, copper foil, gold foil, titanium foil, nickel foil, magnesium foil, aluminum alloy foil, copper alloy foil, gold alloy foil, titanium alloy foil, nickel alloy foil, magnesium alloy foil, and stainless steel foil. Among these, aluminum foil is desirably used as the metal foil. This is because aluminum foil is available at a low price and the production cost of the electromagnetic wave absorber 1a can be reduced.

The electrically conductive layer 20 may include, for example, a layer containing metal particles subjected to a surface treatment. Examples of a surface-treated metal included in the metal particles include copper, nickel, zinc, and their alloys. The material with which the surface of the above metal is treated and which is included in the metal particles is silver, gold, nickel, copper, or cobalt. Among these, the surface treatment is desirably performed with silver which has good electrical conductivity. For example, the mass of the surface treatment agent in the metal particles is 5 to 30%, desirably 5 to 20%, and more desirably 10 to 20%, of the total mass of the metal particles. In this case, when the surface treatment is performed with silver, for example, the surface of the metal particles has good electrical conductivity and the raw material cost of the metal particles can be reduced.

For example, the metal particles are in contact with each other in the layer containing the metal particles. The layer containing the metal particles includes a binder. At least a portion of the surface of the metal particles is in contact with the binder in the electrically conductive layer 20, and the metal particles are dispersed in the binder. Examples of the binder include an acrylic resin, ethylene-vinyl acetate copolymer (EVA), acrylonitrile-butadiene rubber (NBR), nitrile rubber, ethylene-propylene-diene rubber, silicone rubber, and polyurethane. In terms of flexibility and extensibility, the binder is desirably an acrylic resin or polyurethane.

The metal particles have a particle diameter of, for example, 1 to 100 μm, more preferably 1 to 50 μm, and even more preferably 1 to 20 μm. In the case where the metal particles have a particle diameter of 1 μm or more, the metal particles are easily brought into contact with each other while the amount of the metal particles added is reduced. Additionally, in the case where the metal particles have a particle diameter of 100 μm or less, the thickness of the electrically conductive layer 20 can be decreased and, when the electromagnetic wave absorber 1a is bent, the metal particles are likely to be maintained in contact with each other. The particle diameter of the metal particles is a median diameter (D50) at 50% in a volume-based cumulative distribution obtained, for example, by a laser diffraction-scattering particle size distribution measurement method.

In the case where the electrically conductive layer 20 includes the metal foil or the layer containing the metal particles, the electrically conductive layer 20 may further include a support supporting these layers. The support is a polymer sheet, for example. Examples of a material of the support include polyethylene terephthalate (PET), polyethylene naphthalate (PEN), polyimide (PI), an acrylic resin, polycarbonate (PC), polyolefin, polyethylene (PE), polypropylene (PP), cycloolefin polymer (COP), polyurethane, a urethane acrylic resin, cast polypropylene (CPP) and a vinylidene chloride resin. In the case where the electrically conductive layer 20 is the metal foil, the metal foil is desirably placed on a sheet made of a polyester such as PET. In the case where the electrically conductive layer 20 has the support, the sheet resistance of the electrically conductive layer 20 refers to a sheet resistance measured on the metal foil or on the layer containing the metal particles.

In the case where the electrically conductive layer 20 includes the metal foil, a pair of polymer sheets may be placed respectively on both principal surfaces of the metal foil. This allows the electrically conductive layer 20 to have high durability. The pair of polymer sheets are made of, for example, the material mentioned as that of the support, and desirably made of a polyester such as PET.

The electrically conductive layer 20 has a Young's modulus of 4.8 to 200 GPa, for example. This allows the electromagnetic wave absorber 1a to be bent more reliably.

The dielectric layer 30 is formed of, for example, a polymer sheet having a relative permittivity of 1 to 20. The dielectric layer 30 is formed of a polymer sheet having desirably a relative permittivity of 2 to 20. This makes it likely that the electromagnetic wave absorber 1a exhibits desired electromagnetic wave absorption performance. The relative permittivity of the dielectric layer 30 can be measured, for example, by a free-space method.

Examples of the material of the polymer sheet of the dielectric layer 30 include synthetic resins such as ethylene-vinyl acetate copolymer (EVA), polyvinyl chloride, polyurethane, acrylic resin, acrylic urethane resin, polyolefin, polypropylene, polyethylene, silicone resin, polyethylene terephthalate, polyester, polystyrene, polyimide, polycarbonate, polyamide, polysulfone, polyethersulfone, and epoxy resin and synthetic rubbers such as polyisoprene rubber, polystyrene-butadiene rubber, polybutadiene rubber, chloroprene rubber, acrylonitrile-butadiene rubber, butyl rubber, acrylic rubber, ethylene propylene rubber, and silicone rubber. One of these may be used alone as the material of the polymer sheet of the dielectric layer 30, or a combination of two or more thereof may be used as the material of the polymer sheet of the dielectric layer 30. In terms of decreasing the thickness of the dielectric layer 30 to decrease the thickness of the electromagnetic wave absorber 1a, polyurethane, acrylic resin, or acrylic urethane resin is desirably used as the material of the polymer sheet of the dielectric layer 30. In terms of the moldability and relative permittivity, it is also desirable to use EVA as the material of the polymer sheet of the dielectric layer 30.

The dielectric layer 30 may be a single layer, or may be a laminate consisting of a plurality of layers. When the dielectric layer 30 is a laminate consisting of a plurality of layers, the relative permittivity of the dielectric layer 30 can be determined by measuring the respective layers for the relative permittivity, multiplying the obtained relative permittivity values of the respective layers by the proportions of the thicknesses of the respective layers to the thickness of the whole dielectric layer 30, and adding the resultant values.

The dielectric layer 30 has a Young's modulus of 0.3 to 6000 MPa, for example. This allows the electromagnetic wave absorber 1a to be bent more reliably.

In the electromagnetic wave absorber 1a, the electrically conductive layer 20 has no slits. This makes it possible to inhibit more effectively an electromagnetic wave to be absorbed from passing through the electromagnetic wave absorber 1a.

In the electromagnetic wave absorber 1a, the transmission loss when a 76.5-GHz electromagnetic wave is incident perpendicularly thereto is, for example, 10 dB or more, desirably 20 dB or more, more desirably 30 dB or more, and even more desirably 40 dB or more. The transmission loss of the electromagnetic wave absorber 1a can be measured by, for example, placing the electromagnetic wave absorber 1a between a transmission antenna and a receiving antenna that are arranged on a straight line, using a measuring apparatus LAF-26.5A available from KEYCOM Corporation and a free-space method.

The electromagnetic wave absorber 1a can be modified in various respects. For example, the electromagnetic wave absorber 1a may be modified into an electromagnetic wave absorber 1b shown in FIG. 3 and FIG. 4, or an electromagnetic wave absorber 1c shown in FIG. 5. The electromagnetic wave absorber 1b and the electromagnetic wave absorber 1c are configured in the same manner as the electromagnetic wave absorber 1a unless otherwise described. Their components that are identical to or corresponding to the components of the electromagnetic wave absorber 1a are indicated by the same reference numerals and detailed descriptions thereof are omitted. The descriptions given for the electromagnetic wave absorber 1a are applicable to the electromagnetic wave absorber 1b and the electromagnetic wave absorber 1c unless there is a technical inconsistency.

Figure 3:
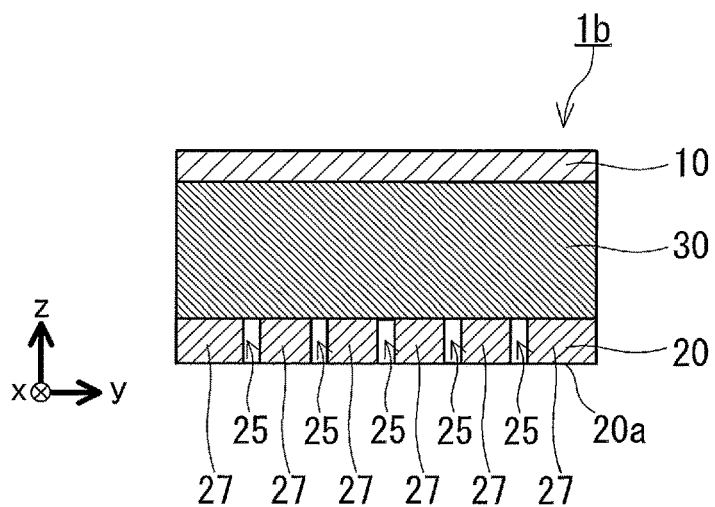
FIG. 3 is a cross-sectional view showing another example of the electromagnetic wave absorber of the present invention.
Figure 4:
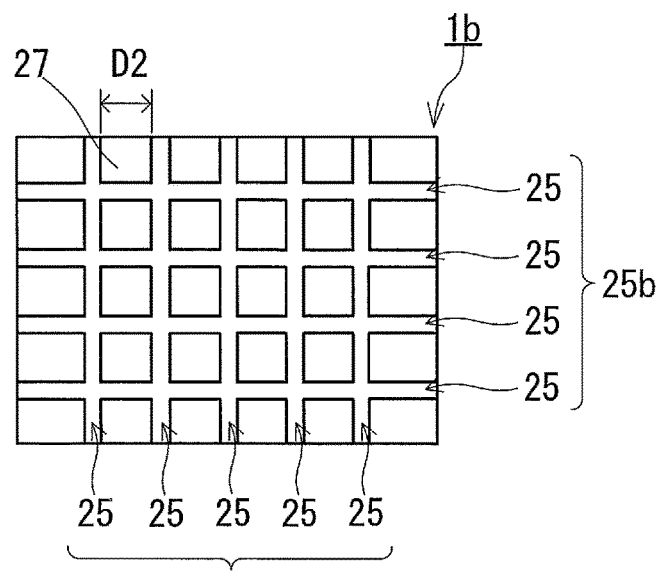
FIG. 4 is a plan view of the electromagnetic wave absorber shown in FIG. 3.

As shown in FIG. 3, the electromagnetic wave absorber 1b does not have the first slit 15 but has a second slit 25. The second slit 25 extends, in the electrically conductive layer 20, from a second principal surface 20a distal to the dielectric layer 30 toward the dielectric layer 30 in a direction perpendicular to the second principal surface 20a and divides the electrically conductive layer 20 into a plurality of second blocks 27. As shown in FIG. 4, each of the second blocks 27 has a minimum dimension D2 of 1 mm or more at the second principal surface 20a. It is conceived that the slit formed in the electrically conductive layer affects the back surface reflection of the electromagnetic wave. The present inventors also made intensive studies on the influence that the slit formed in the electrically conductive layer has on the electromagnetic wave absorption performance of the electromagnetic wave absorber. As a result, they found that the electromagnetic wave absorber is likely to exhibit excellent electromagnetic wave absorption performance when each of the blocks of the electrically conductive layer divided by the slit has a minimum dimension of 1 mm or more. Based on this new finding, the present inventors have invented the electromagnetic wave absorber according to the present invention.

When the second principal surface 20a is viewed in plane, the minimum dimension D2 is typically the smaller one of the minimum value of a distance between vertexes and the shortest distance between lines that do not intersect each other in a plane figure representing an outline of the second block 27. In this case, each of the vertexes means the vertex of an angle. Each of the vertexes can be formed by straight lines intersecting each other, curves intersecting each other, or a straight line and a curve intersecting each other. On the other hand, in the case where, when the second principal surface 20a is viewed in plane, an outline of the plane figure representing the outline of the second block 27 includes a curve such as an arc and also the number of the vertexes of the plane figure is two or less, the minimum dimension D2 is a dimension in a direction in which a line passing through two points on the outline of the plane figure and the center of gravity of the plane figure has the shortest length.

The minimum dimension D2 of each of the second blocks 27 at the second principal surface 20a is desirably 2 mm or more, more desirably 6 mm or more, and even more desirably 10 mm or more. This makes it likely that the electromagnetic wave absorber exhibits excellent electromagnetic wave absorption performance more reliably.

The depth of the second slit 25 in a thickness direction of the electromagnetic wave absorber 1b is not particularly limited. The second slit 25 may have a bottom inside the electrically conductive layer 20 or may extend through the electrically conductive layer 20 in the thickness direction of the electromagnetic wave absorber 1b. In a direction parallel to the second principal surface 20a, an end of the second slit 25 may be positioned at an end of the second principal surface 20a, or may be positioned apart from the end of the second principal surface 20a. The second slit 25 may be formed so that a clearance is present between the second blocks 27 adjacent to each other, or may be formed so that the second blocks 27 adjacent to each other can be in contact with each other. Typically, the second slit 25 extends linearly in the direction parallel to the second principal surface 20a. The second slit 25 may extend curvilinearly.

When the second principal surface 20a is level, an area of the plurality of second blocks 27 at the second principal surface 20a is 90% or more of a sum of the area of the plurality of second blocks 27 and an area of an opening of the second slit 25. Even in the case where the electromagnetic wave absorber 1b has the second slit 25, the back surface reflection of the electromagnetic wave to be absorbed is more likely to occur on the electrically conductive layer 20 as the area of the plurality of second blocks 27 at the second principal surface 20a increases. As a result, it is possible to inhibit the electromagnetic wave to be absorbed from passing through the electromagnetic wave absorber 1b more reliably, and the electromagnetic wave absorber 1b is likely to have excellent electromagnetic wave absorption performance. When the second principal surface 20a is level, the area of the plurality of second blocks 27 at the second principal surface 20a is desirably 95% or more, more desirably 99% or more of the sum of the area of the plurality of second blocks 27 and the area of the opening of the second slit 25. This makes it likely that the electromagnetic wave absorber 1b exhibits excellent electromagnetic wave absorption performance more reliably.

As shown in FIG. 4, the electromagnetic wave absorber 1b has a plurality of the second slits 25, for example. The plurality of the second slits 25 include a third slit group 25a, for example. The third slit group 25a is composed of a plurality of the second slits 25 parallel to each other at the second principal surface 20a. In this case, the minimum dimension of each of the second blocks 27 at the second principal surface 20a is desirably 20 mm or less. In this case, it is easy to attach the electromagnetic wave absorber 1b to an article having a curved face with a large curvature.

As shown in FIG. 4, the plurality of the second slits 25 in the electromagnetic wave absorber 1b further include a fourth slit group 25b, for example. The fourth slit group 25b is composed of a plurality of the second slits 25 that are parallel to each other at the second principal surface 20a and that intersect the plurality of the second slits 25 included in the third slit group 25a. In this case, it is possible to bend the electromagnetic wave absorber 1b in a plurality of directions, and thus it is easy to attach the electromagnetic wave absorber 1b also to an article having a complex shape.

When the second principal surface 20a is viewed in plane, the plane figure representing the outline of the second block 27 may be a triangle, a quadrangle or another polygon, or a part or all of the outline may be a curvilinear figure.

In the electromagnetic wave absorber 1b, the transmission loss when a 76.5-GHz electromagnetic wave is incident perpendicularly thereto is, for example, 10 dB or more, and desirably 20 dB or more.

The absolute value of a reflection amount measured in compliance with JIS R 1679:2007 when a 76.5-GHz electromagnetic wave is incident perpendicularly to the electromagnetic wave absorber 1b is, for example, 10 dB or more, desirably 20 dB or more, and more desirably 30 dB or more.

Figure 5:
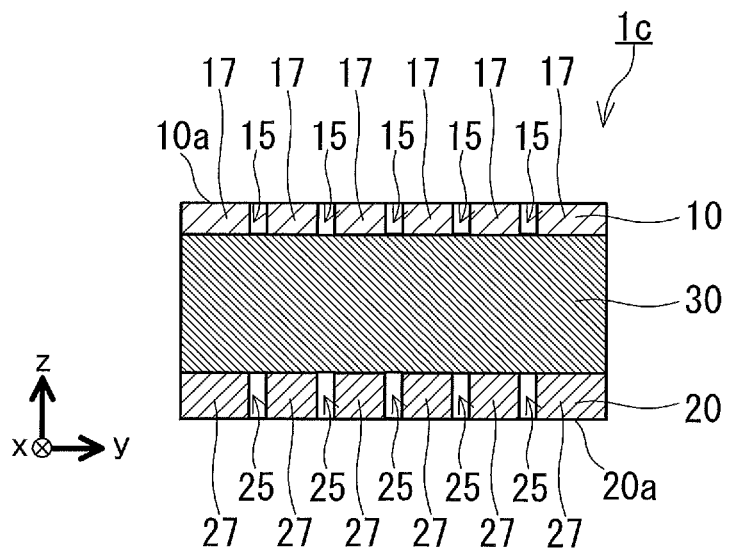
FIG. 5 is a cross-sectional view showing still another example of the electromagnetic wave absorber according to the present invention.

As shown in FIG. 5, the electromagnetic wave absorber 1c has the first slit 15 and the second slit 25. In the electromagnetic wave absorber 1c, the first slit 15 can be formed in the same manner as the first slit 15 of the electromagnetic wave absorber 1a. In addition, the second slit 25 can be formed in the same manner as the second slit 25 of the electromagnetic wave absorber 1b.

According to the electromagnetic wave absorber 1c, the electromagnetic wave absorber 1c can be bent in such a manner that the opening of the first slit 15 is enlarged, and the electromagnetic wave absorber 1c can also be bent in such a manner that the opening of the second slit 25 is enlarged. This makes it easy to attach the electromagnetic wave absorber 1c also to an article having a more complex surface.

In the electromagnetic wave absorber 1c, the transmission loss when a 76.5-GHz electromagnetic wave is incident perpendicularly thereto is, for example, 10 dB or more, and desirably 20 dB or more.

The absolute value of a reflection amount measured in compliance with JIS R 1679:2007 when a 76.5-GHz electromagnetic wave is incident perpendicularly to the electromagnetic wave absorber 1c is, for example, 10 dB or more, and desirably 20 dB or more.

Figure 6:
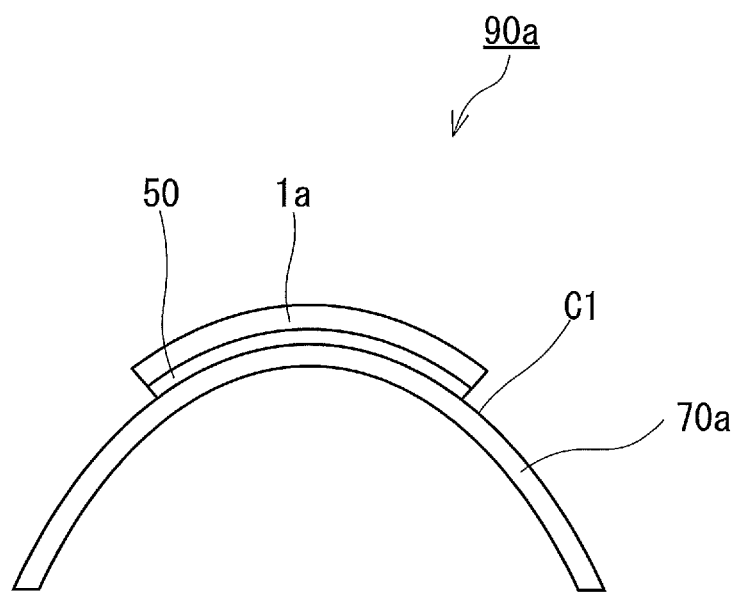
FIG. 6 is a side view showing an example of an article with an electromagnetic wave absorber according to the present invention.
Figure 7:
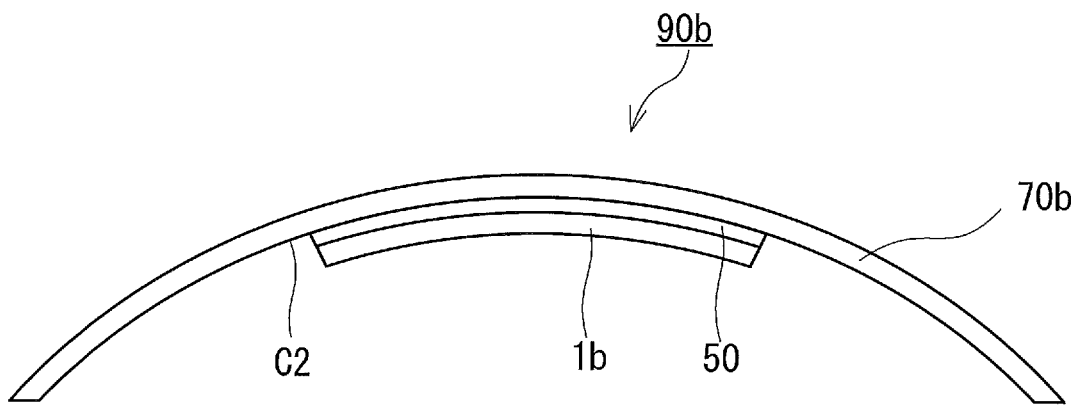
FIG. 7 is a side view showing another example of the article with an electromagnetic wave absorber according to the present invention.
Figure 8:
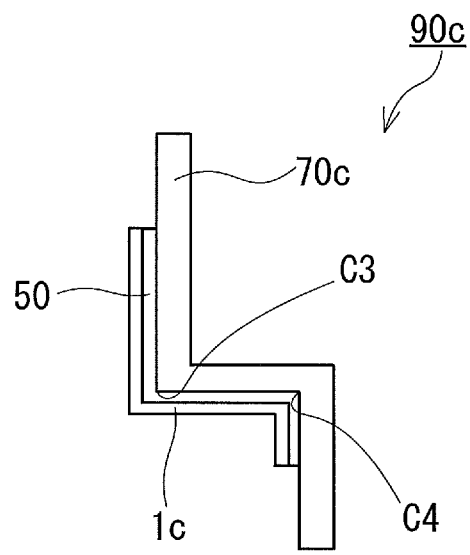
FIG. 8 is a side view showing still another example of the article with an electromagnetic wave absorber according to the present invention.

An article with an electromagnetic wave absorber can be produced using the electromagnetic wave absorber 1a, the electromagnetic wave absorber 1b or the electromagnetic wave absorber 1c. As shown in FIGS. 6 to 8, the article with an electromagnetic wave absorber includes an article having a curved face or a corner, and the electromagnetic wave absorber that is adhered to the curved face or adhered to across the corner. Typically, the electromagnetic wave absorber is adhered so that the electrically conductive layer is positioned closer to the article than the resistive layer is.

As shown in FIG. 6, an article 90a with an electromagnetic wave absorber includes an article 70a having a curved face C1, and the electromagnetic wave absorber 1a. The electromagnetic wave absorber 1a is adhered to the curved face C1 with an adhesive layer 50, for example. In this case, the electromagnetic wave absorber 1a is deformed along the curved face C1 in such a manner that the opening of the first slit 15 is enlarged.

As shown in FIG. 7, an article 90b with an electromagnetic wave absorber includes an article 70b having a curved face C2, and the electromagnetic wave absorber 1b. The electromagnetic wave absorber 1b is adhered to the curved face C2 with the adhesive layer 50, for example. In this case, the electromagnetic wave absorber 1b is deformed along the curved face C2 in such a manner that the opening of the second slit 25 is enlarged.

As shown in FIG. 8, an article 90c with an electromagnetic wave absorber includes an article 70c having a corner C3 and a corner C4, and the electromagnetic wave absorber 1c. The electromagnetic wave absorber 1c is adhered to across the corner C3 and the corner C4 with the adhesive layer 50. In this case, the electromagnetic wave absorber 1c is deformed along the corner C3 in such a manner that the opening of the first slit 15 is enlarged, and the electromagnetic wave absorber 1c is deformed along the corner C4 in such a manner that the opening of the second slit 25 is enlarged.

The electromagnetic wave absorber 1a, the electromagnetic wave absorber 1b and the electromagnetic wave absorber 1c can be manufactured by a method including the steps (i) to (iv) below, for example.

(i) Providing the resistive layer 10.

(ii) Providing the electrically conductive layer 20.

(iii) Disposing the dielectric layer 30 between the resistive layer 10 and the electrically conductive layer 20.

(iv) Forming at least one of the first slit 15 and the second slit 25.

In the step (iii) mentioned above, the resistive layer 10 and the dielectric layer 30 may be adhered to each other with an adhesive, for example. In the case where the dielectric layer 30 has adhesiveness, the resistive layer 10 and the dielectric layer 30 may be placed one on the other without the adhesive therebetween. The electrically conductive layer 20 and the dielectric layer 30 may be adhered to each other with an adhesive, for example. In the case where the dielectric layer 30 has adhesiveness, the electrically conductive layer 20 and the dielectric layer 30 may be placed one on the other without the adhesive therebetween.

In the case where the first slit 15 is formed in the step (iv) mentioned above, the resistive layer 10 is formed continuously and the first slit 15 is formed by cutting the resistive layer 10 formed continuously, for example. The resistive layer 10 may be cut, for example, by using a cutting tool such as a Thomson blade, a graver and an etching blade, or by using a laser beam machine. The resistive layer 10 may be cut after the resistive layer 10 and the dielectric layer 30 are placed one on the other, or may be cut before the resistive layer 10 and the dielectric layer 30 are placed one on the other. In the case where the resistive layer 10 is cut after the resistive layer 10 and the dielectric layer 30 are placed one on the other, it is desirable that the dielectric layer 30 have adhesiveness. This is because the properties of the dielectric layer 30 are unlikely to be affected even when the cutting reaches the dielectric layer 30. It should be noted that the first slit 15 may be formed by forming the resistive layer 10 discontinuously at the first principal surface 10a.

In the case where the second slit 25 is formed in the step (iv) mentioned above, the electrically conductive layer 20 is formed continuously and the second slit 25 is formed by cutting the electrically conductive layer 20 formed continuously, for example. The electrically conductive layer 20 may be cut, for example, by using a cutting tool such as a Thomson blade, a graver and an etching blade, or by using a laser beam machine. The electrically conductive layer 20 may be cut after the electrically conductive layer 20 and the dielectric layer 30 are placed one on the other, or may be cut before the electrically conductive layer 20 and the dielectric layer 30 are placed one on the other. In the case where the electrically conductive layer 20 is cut after the electrically conductive layer 20 and the dielectric layer 30 are placed one on the other, it is desirable that the dielectric layer 30 have adhesiveness. This is because the properties of the dielectric layer 30 are unlikely to be affected even when the cutting reaches the dielectric layer 30. It should be noted that the second slit 25 is formed by forming the electrically conductive layer 20 discontinuously at the second principal surface 20a.

EXAMPLES

Hereinafter, the present invention will be described in more detail by examples. The present invention is not limited to the following examples.

Example 1

On a film-like support (thickness: 38 μm) made of a polyester was formed a functional layer using an ITO containing 30 weight % of $SnO_2$ to have a sheet resistance of 390 Ω/□. A resistive layer according to Example 1 was thus produced. The support had a Young's modulus of 4700 MPa. An aluminum-foil-including PET film in which a 25-μm-thick PET layer, a 7-μm-thick aluminum layer and a 9-μm-thick PET layer were stacked in this order was prepared as an electrically conductive layer according to Example 1. The electrically conductive layer had a Young's modulus of 4880 MPa. An acrylic resin press-molded to have a thickness of 560 μm was prepared as a dielectric layer according to Example 1. The dielectric layer according to Example 1 had an elasticity modulus (Young's modulus) of 0.4 MPa. The dielectric layer had a relative permittivity of 2.55. The dielectric layer according to Example 1 was placed on the electrically conductive layer according to Example 1. Further, the resistive layer according to Example 1 was placed on the dielectric layer according to Example 1 in the state in which a principal surface formed by the support of the resistive layer according to Example 1 faced the dielectric layer according to Example 1. The resistive layer according to Example 1 was cut from the functional layer side at 2 mm intervals using a cutter to form two linear slit groups intersecting perpendicularly to each other across the entire resistive layer according to Example 1 as shown in FIG. 2. An electromagnetic wave absorber according to Example 1 was thus obtained. In the electromagnetic wave absorber according to Example 1, the two linear slit groups divided the resistive layer into a plurality of blocks each having a minimum dimension of 2 mm at a principal surface formed by the functional layer.

Example 2

An electromagnetic wave absorber according to Example 2 was produced in the same manner as in Example 1, except that the intervals at which the resistive layer was cut was changed to 4 mm. In the electromagnetic wave absorber according to Example 2, the two linear slit groups divided the resistive layer into a plurality of blocks each having a minimum dimension of 4 mm at the principal surface formed by the functional layer of the resistive layer.

Example 3

An electromagnetic wave absorber according to Example 3 was produced in the same manner as in Example 1, except that the intervals at which the resistive layer was cut was changed to 6 mm. In the electromagnetic wave absorber according to Example 3, the two linear slit groups divided the resistive layer into a plurality of blocks each having a minimum dimension of 6 mm at the principal surface formed by the functional layer of the resistive layer.

Example 4

An electromagnetic wave absorber according to Example 4 was produced in the same manner as in Example 1, except that the intervals at which the resistive layer was cut was changed to 10 mm. In the electromagnetic wave absorber according to Example 4, the two linear slit groups divided the resistive layer into a plurality of blocks each having a minimum dimension of 10 mm at the principal surface formed by the functional layer of the resistive layer.

Example 5

An electromagnetic wave absorber according to Example 5 was produced in the same manner as in Example 1, except that the intervals at which the resistive layer was cut was changed to 20 mm. In the electromagnetic wave absorber according to Example 5, the two linear slit groups divided the resistive layer into a plurality of blocks each having a minimum dimension of 20 mm at the principal surface formed by the functional layer.

Example 6

An electromagnetic wave absorber according to Example 6 was produced in the same manner as in Example 1 except for the following. In the production of the resistive layer, a film-like support that was made of a polyester and had a thickness of 23 μm was used. The intervals at which the resistive layer was cut was adjusted to 20 mm. In the electromagnetic wave absorber according to Example 6, the two linear slit groups divided the resistive layer into a plurality of blocks each having a minimum dimension of 20 mm at the principal surface formed by the functional layer.

Example 7

An electromagnetic wave absorber according to Example 7 was produced in the same manner as in Example 1, except that the support of the resistive layer was changed to a film-like support that was made of a polyester and had a thickness of 50 μm and the intervals at which the resistive layer was cut was adjusted to 4 mm. In the electromagnetic wave absorber according to Example 7, the two linear slit groups divided the resistive layer into a plurality of blocks each having a minimum dimension of 4 mm at the principal surface formed by the functional layer.

Example 8

An electromagnetic wave absorber according to Example 8 was produced in the same manner as in Example 1 except for the following. In the production of the resistive layer, a film-like support that was made of a polyester and had a thickness of 125 μm was used. The intervals at which the resistive layer was cut was adjusted to 20 mm. In the electromagnetic wave absorber according to Example 8, the two linear slit groups divided the resistive layer into a plurality of blocks each having a minimum dimension of 20 mm at the principal surface formed by the functional layer.

Example 9

An aluminum foil having a thickness of 100 μm was prepared as an electrically conductive layer according to Example 9. The electrically conductive layer according to Example 9 had a Young's modulus of 69000 MPa. An electromagnetic wave absorber according to Example 9 was produced in the same manner as in Example 1, except that the electrically conductive layer according to Example 9 was used instead of the electrically conductive layer according to Example 1 and the intervals at which the resistive layer was cut was changed to 6 mm. In the electromagnetic wave absorber according to Example 9, the two linear slit groups divided the resistive layer into a plurality of blocks each having a minimum dimension of 6 mm at the principal surface formed by the functional layer.

Example 10

An electromagnetic wave absorber according to Example 10 was produced in the same manner as in Example 9, except that the intervals at which the resistive layer was cut was changed to 20 mm. In the electromagnetic wave absorber according to Example 10, the two linear slit groups divided the resistive layer into a plurality of blocks each having a minimum dimension of 20 mm at the principal surface formed by the functional layer.

Example 11

On a film-like support (thickness: 38 µm) made of a polyester was formed a functional layer using an ITO containing 30 weight % of $SnO_2$ to have a sheet resistance of 390Ω/□. A resistive layer according to Example 11 was thus produced. The support had a Young's modulus of 4700 MPa. An aluminum-foil-including PET film in which a 25-µm-thick PET layer, a 7-µm-thick aluminum layer and a 9-µm-thick PET layer were stacked in this order was prepared as an electrically conductive layer according to Example 11. The electrically conductive layer had a Young's modulus of 4880 MPa. An acrylic resin press-molded to have a thickness of 560 µm was prepared as a dielectric layer according to Example 11. The dielectric layer according to Example 11 had an elasticity modulus (Young's modulus) of 0.4 MPa. The dielectric layer had a relative permittivity of 2.55. The dielectric layer according to Example 11 was placed on the electrically conductive layer according to Example 11. Further, the resistive layer according to Example 11 was placed on the dielectric layer according to Example 11 in the state in which a principal surface formed by the support of the resistive layer according to Example 11 faced the dielectric layer according to Example 11. The electrically conductive layer according to Example 11 was cut from the side of the PET layer, which is distal to the dielectric layer, of the electrically conductive layer according to Example 11 at 1 mm intervals using a cutter to form two linear slit groups intersecting perpendicularly to each other across the entire electrically conductive layer according to Example 11 as shown in FIG. 4. An electromagnetic wave absorber according to Example 11 was thus obtained. In the electromagnetic wave absorber according to Example 11, the two linear slit groups divided the electrically conductive layer into a plurality of blocks each having a minimum dimension of 1 mm at a principal surface formed by the PET layer distal to the dielectric layer.

Example 12

An electromagnetic wave absorber according to Example 12 was produced in the same manner as in Example 11, except that the intervals at which the electrically conductive layer was cut was changed to 2 mm. In the electromagnetic wave absorber according to Example 12, the two linear slit groups divided the electrically conductive layer into a plurality of blocks each having a minimum dimension of 2 mm at the principal surface formed by the PET layer distal to the dielectric layer.

Example 13

An electromagnetic wave absorber according to Example 13 was produced in the same manner as in Example 11, except that the intervals at which the electrically conductive layer was cut was changed to 6 mm. In the electromagnetic wave absorber according to Example 13, the two linear slit groups divided the electrically conductive layer into a plurality of blocks each having a minimum dimension of 6 mm at the principal surface formed by the PET layer distal to the dielectric layer.

Example 14

An electromagnetic wave absorber according to Example 14 was produced in the same manner as in Example 11, except that the intervals at which the electrically conductive layer was cut was changed to 10 mm. In the electromagnetic wave absorber according to Example 14, the two linear slit groups divided the electrically conductive layer into a plurality of blocks each having a minimum dimension of 10 mm at the principal surface formed by the PET layer distal to the dielectric layer.

Example 15

An electromagnetic wave absorber according to Example 15 was produced in the same manner as in Example 11, except that the intervals at which the electrically conductive layer was cut was changed to 20 mm. In the electromagnetic wave absorber according to Example 15, the two linear slit groups divided the electrically conductive layer into a plurality of blocks each having a minimum dimension of 20 mm at a principal surface of the electrically conductive layer.

Example 16

An electromagnetic wave absorber according to Example 16 was produced in the same manner as in Example 11, except that the support of the resistive layer was changed to a film-like support that was made of a polyester and had a thickness of 50 µm and the intervals at which the electrically conductive layer was cut was adjusted to 2 mm. In the electromagnetic wave absorber according to Example 16, the two linear slit groups divided the electrically conductive layer into a plurality of blocks each having a minimum dimension of 2 mm at the principal surface of the electrically conductive layer.

Example 17

An aluminum foil having a thickness of 100 µm was prepared as an electrically conductive layer according to Example 17. The electrically conductive layer according to Example 17 had a Young's modulus of 69000 MPa. An electromagnetic wave absorber according to Example 17 was produced in the same manner as in Example 11, except that the electrically conductive layer according to Example 17 was used instead of the electrically conductive layer according to Example 11 and the intervals at which the electrically conductive layer was cut was changed to 2 mm. In the electromagnetic wave absorber according to Example 17, the two linear slit groups divided the electrically conductive layer into a plurality of blocks each having a minimum dimension of 2 mm at the principal surface of the electrically conductive layer.

Example 18

An electromagnetic wave absorber according to Example 18 was produced in the same manner as in Example 17, except that the intervals at which the electrically conductive layer was cut was changed to 20 mm. In the electromagnetic wave absorber according to Example 18, the two linear slit groups divided the electrically conductive layer into a plurality of blocks each having a minimum dimension of 20 mm at the principal surface of the electrically conductive layer.

Comparative Example 1

An electromagnetic wave absorber according to Comparative Example 1 was produced in the same manner as in Example 1, except that the cutting of the resistive layer was omitted.

Comparative Example 2

An electromagnetic wave absorber according to Comparative Example 2 was produced in the same manner as in Example 1, except that the intervals at which the resistive layer was cut was changed to 1 mm. In the electromagnetic wave absorber according to Comparative Example 2, the two linear slit groups divided the resistive layer into a plurality of blocks each having a minimum dimension of 1 mm at the principal surface formed by the functional layer of the resistive layer.

Comparative Example 3

An electromagnetic wave absorber according to Comparative Example 3 was produced in the same manner as in Example 11, except that the intervals at which the electrically conductive layer was cut was changed to 0.5 mm. In the electromagnetic wave absorber according to Comparative Example 3, the two linear slit groups divided the electrically conductive layer into a plurality of blocks each having a minimum dimension of 0.5 mm at the principal surface of the electrically conductive layer.

(Evaluation of Electromagnetic Wave Absorption Performance)

The reflection amount was measured in compliance with JIS R 1679:2007 using a measuring apparatus LAF-26.5A available from KEYCOM Corporation when a 76.5-GHz electromagnetic wave was incident perpendicularly to the electromagnetic wave absorber according to each of the Examples and the electromagnetic wave absorber according to each of the Comparative Examples. Table 1 shows the results. In addition, the transmission loss was measured using a measuring apparatus LAF-26.5A available from KEYCOM Corporation when a 76.5-GHz electromagnetic wave was incident perpendicularly to the electromagnetic wave absorber according to each of the Examples and the electromagnetic wave absorber according to each of the Comparative Examples. The transmission loss was measured by placing the electromagnetic wave absorber between a transmission antenna and a receiving antenna that were arranged on a straight line using a free-space method. Table 1 shows the results. As shown in Table 1, the absolute value of absorption amount was 10 dB or more and the transmission loss was 10 dB or more on the electromagnetic wave absorber according to each of the Examples. In contrast, the absolute value of absorption amount was less than 10 dB on the electromagnetic wave absorber according to Comparative Example 2, and the transmission loss was less than 10 dB on the electromagnetic wave absorber according to Comparative Example 3.

(Evaluation of Bendability)

A metal pillar A having an outer diameter of 50 mm and a length of 100 mm and a metal pillar B having an outer diameter of 100 mm and a length of 100 mm were prepared. The electromagnetic wave absorber according to each of the Examples and Comparative Examples was disposed across the pillar A or the pillar B along a side thereof, and an end of the electromagnetic wave absorber was fixed and a force of 5 N was applied to the other end of the electromagnetic wave absorber. The length of the electromagnetic wave absorber in a direction parallel to an axis line of the pillar A or the pillar B was 100 mm. At that time, it was confirmed whether the electromagnetic wave absorber was in close contact with the pillar A or the pillar B. It was evaluated as "a" when the electromagnetic wave absorber was in close contact with the pillar A. It was evaluated as "b" when the electromagnetic wave absorber failed to be in close contact with the pillar A but was in close contact with the pillar B. It was evaluated as "c" when the electromagnetic wave absorber failed to be in close contact with both of the pillar A and the pillar B. Table 1 shows the results. As shown in Table 1, the electromagnetic wave absorber according to each of the Examples was in close contact at least with the pillar B and had excellent bendability. In contrast, the electromagnetic wave absorber according to Comparative Example 1 failed to be in close contact with both of the pillar A and the pillar B and it was difficult to say that it had excellent bendability.

TABLE 1

| | Support of resistive layer Thickness (μm) | Dielectric layer Material | Dielectric layer Elasticity modulus (MPa) | Electrically conductive layer Stacking configuration of electrically conductive layer | Electrically conductive layer Thickness of metal layer (μm) | Minimum dimension of blocks of resistive layer D1 (mm) | Minimum dimension of blocks of electrically conductive layer D2 (mm) | Evaluation of electromagnetic wave properties Reflection loss @76.5 GHz (−dB) | Evaluation of electromagnetic wave properties Transmission loss @76.5 GHz (−dB) | Bendability evaluation results |
|---|---|---|---|---|---|---|---|---|---|---|
| Example 1 | 38 | Acrylic resin | 0.4 | PET/Al/PET | 7 | 2 | No cutting | 13 | 60 or more | a |
| Example 2 | 38 | Acrylic resin | 0.4 | PET/Al/PET | 7 | 4 | No cutting | 21 | 60 or more | a |

TABLE 1-continued

Configuration of electromagnetic wave absorber

| | Support of resistive layer Thickness (μm) | Dielectric layer Material | Dielectric layer Elasticity modulus (MPa) | Electrically conductive layer Stacking configuration of electrically conductive layer | Electrically conductive layer Thickness of metal layer (μm) | Minimum dimension of blocks of resistive layer D1 (mm) | Minimum dimension of blocks of electrically conductive layer D2 (mm) | Evaluation of electromagnetic wave properties Reflection loss @76.5 GHz (-dB) | Evaluation of electromagnetic wave properties Transmission loss @76.5 GHz (-dB) | Bendability evaluation results |
|---|---|---|---|---|---|---|---|---|---|---|
| Example 3 | 38 | Acrylic resin | 0.4 | PET/Al/PET | 7 | 6 | No cutting | 22 | 60 or more | a |
| Example 4 | 38 | Acrylic resin | 0.4 | PET/Al/PET | 7 | 10 | No cutting | 25 | 60 or more | b |
| Example 5 | 38 | Acrylic resin | 0.4 | PET/Al/PET | 7 | 20 | No cutting | 30 | 60 or more | b |
| Example 6 | 23 | Acrylic resin | 0.4 | PET/Al/PET | 7 | 20 | No cutting | 30 | 60 or more | b |
| Example 7 | 50 | Acrylic resin | 0.4 | PET/Al/PET | 7 | 4 | No cutting | 20 | 60 or more | a |
| Example 8 | 125 | Acrylic resin | 0.4 | PET/Al/PET | 7 | 20 | No cutting | 30 | 60 or more | b |
| Example 9 | 38 | Acrylic resin | 0.4 | Al | 100 | 6 | No cutting | 24 | 60 or more | a |
| Example 10 | 38 | Acrylic resin | 0.4 | Al | 100 | 20 | No cutting | 24 | 60 or more | b |
| Example 11 | 38 | Acrylic resin | 0.4 | PET/Al/PET | 7 | No cutting | 1 | 33 | 17 | a |
| Example 12 | 38 | Acrylic resin | 0.4 | PET/Al/PET | 7 | No cutting | 2 | 33 | 23 | a |
| Example 13 | 38 | Acrylic resin | 0.4 | PET/Al/PET | 7 | No cutting | 6 | 33 | 32 | a |
| Example 14 | 38 | Acrylic resin | 0.4 | PET/Al/PET | 7 | No cutting | 10 | 33 | 47 | b |
| Example 15 | 38 | Acrylic resin | 0.4 | PET/Al/PET | 7 | No cutting | 20 | 34 | 60 or more | b |
| Example 16 | 50 | Acrylic resin | 0.4 | PET/Al/PET | 7 | No cutting | 2 | 34 | 22 | a |
| Example 17 | 38 | Acrylic resin | 0.4 | Al | 100 | No cutting | 2 | 40 | 23 | a |
| Example 18 | 38 | Acrylic resin | 0.4 | Al | 100 | No cutting | 20 | 40 | 23 | b |
| Comparative Example 1 | 38 | Acrylic resin | 0.4 | PET/Al/PET | 7 | No cutting | No cutting | 34 | 60 or more | c |
| Comparative Example 2 | 38 | Acrylic resin | 0.4 | PET/Al/PET | 7 | 1 | No cutting | 8 | 60 or more | a |

EXPLANATION OF REFERENCE NUMERALS 1a, 1b, 1c Electromagnetic wave absorber
10 Resistive layer
10a First principal surface
15 First slit
15a First slit group
15b Second slit group
17 First block
20 Electrically conductive layer
20a Second principal surface
25 Second slit
25a Third slit group
25b Fourth slit group
27 Second block
30 Dielectric layer

The invention claimed is:

1. An electromagnetic wave absorber comprising:
a resistive layer;
an electrically conductive layer having a sheet resistance lower than a sheet resistance of the resistive layer; and
a dielectric layer disposed between the resistive layer and the electrically conductive layer, wherein
the electromagnetic wave absorber has at least one of a first slit and a second slit,
the first slit extends, in the resistive layer, from a first principal surface distal to the dielectric layer toward the dielectric layer in a direction perpendicular to the first principal surface and divides the resistive layer into a plurality of first blocks,
the second slit extends, in the electrically conductive layer, from a second principal surface distal to the dielectric layer toward the dielectric layer in a direction perpendicular to the second principal surface and divides the electrically conductive layer into a plurality of second blocks,
each of the first blocks has a minimum dimension of 2 mm or more at the first principal surface
each of the second blocks has a minimum dimension of 1 mm or more at the second principal surface,
the electromagnetic wave absorber is a $\lambda/4$ electromagnetic wave absorber, and
the electromagnetic wave absorber satisfies at least one of the following conditions (I), (II) and (III), (I) the electromagnetic wave absorber has the second slit, and
when the second principal surface is level, an area of the plurality of second blocks at the second principal surface is 90% or more of a sum of the area of the plurality of second blocks and an area of an opening of the second slit,
(II) the electromagnetic wave absorber has a plurality of the first slits,
the plurality of the first slits include a first slit group composed of a plurality of the first slits parallel to each other at the first principal surface,
the minimum dimension of the first blocks at the first principal surface is 20 mm or less, and
the plurality of the first slits include a second slit group composed of a plurality of the first slits that are parallel to each other at the first principal surface and that intersect the plurality of the first slits included in the first slit group,
(III) the electromagnetic wave absorber has a plurality of the second slits,
the plurality of the second slits include a third slit group composed of a plurality of the second slits parallel to each other at the second principal surface,
the minimum dimension of the second blocks at the second principal surface is 20 mm or less, and
the plurality of the second slits include a fourth slit group composed of a plurality of the second slits that are parallel to each other at the second principal surface and that intersect the plurality of the second slits included in the third slit group.

2. The electromagnetic wave absorber according to claim 1, wherein
the electromagnetic wave absorber has the second slit, and
when the second principal surface is level, the area of the plurality of second blocks at the second principal surface is 90% or more of the sum of the area of the plurality of second blocks and the area of the opening of the second slit.

3. The electromagnetic wave absorber according to claim 1, wherein
the electromagnetic wave absorber has the plurality of the first slits,
the plurality of the first slits include the first slit group composed of the plurality of the first slits parallel to each other at the first principal surface, and
the minimum dimension of the first blocks at the first principal surface is 20 mm or less.

4. The electromagnetic wave absorber according to claim 3, wherein the plurality of the first slits include the second slit group composed of the plurality of the first slits that are parallel to each other at the first principal surface and that intersect the plurality of the first slits included in the first slit group.

5. The electromagnetic wave absorber according to claim 1, wherein
the electromagnetic wave absorber has the plurality of the second slits,
the plurality of the second slits include the third slit group composed of the plurality of the second slits parallel to each other at the second principal surface, and
the minimum dimension of the second blocks at the second principal surface is 20 mm or less.

6. The electromagnetic wave absorber according to claim 5, wherein the plurality of the second slits include the fourth slit group composed of the plurality of the second slits that are parallel to each other at the second principal surface and that intersect the plurality of the second slits included in the third slit group.

7. The electromagnetic wave absorber according to claim 1, wherein the resistive layer has a sheet resistance of 120 to 800 $\Omega/\square$.

8. An article with an electromagnetic wave absorber, comprising:
an article having a curved face or a corner; and
the electromagnetic wave absorber according to claim 1 that is adhered to the curved face or adhered to across the corner.

9. A method for manufacturing an electromagnetic wave absorber, comprising;
providing a resistive layer;
providing an electrically conductive layer having a sheet resistance lower than a sheet resistance of the resistive layer;
disposing a dielectric layer between the resistive layer and the electrically conductive layer; and
forming at least one of a first slit and a second slit, wherein
the first slit extends, in the resistive layer, from a first principal surface distal to the dielectric layer toward the dielectric layer in a direction perpendicular to the first principal surface and divides the resistive layer into a plurality of first blocks,
the second slit extends, in the electrically conductive layer, from a second principal surface distal to the dielectric layer toward the dielectric layer in a direction perpendicular to the second principal surface and divides the electrically conductive layer into a plurality of second blocks,
each of the first blocks has a minimum dimension of 2 mm or more at the first principal surface,
each of the second blocks has a minimum dimension of 1 mm or more at the second principal surface,
the electromagnetic wave absorber is a $\lambda/4$ electromagnetic wave absorber, and
the electromagnetic wave absorber satisfies at least one of the following conditions (I), (II) and (III),
(I) the electromagnetic wave absorber has the second slit, and
when the second principal surface is level, an area of the plurality of second blocks at the second principal surface is 90% or more of a sum of the area of the plurality of second blocks and an area of an opening of the second slit,
(II) the electromagnetic wave absorber has a plurality of the first slits,
the plurality of the first slits include a first slit group composed of a plurality of the first slits parallel to each other at the first principal surface,
the minimum dimension of the first blocks at the first principal surface is 20 mm or less, and
the plurality of the first slits include a second slit group composed of a plurality of the first slits that are parallel to each other at the first principal surface and that intersect the plurality of the first slits included in the first slit group,
(III) the electromagnetic wave absorber has a plurality of the second slits,
the plurality of the second slits include a third slit group composed of a plurality of the second slits parallel to each other at the second principal surface,
the minimum dimension of the second blocks at the second principal surface is 20 mm or less, and the plurality of the second slits include a fourth slit group composed of a plurality of the second slits that are parallel to each other at the second principal surface and that intersect the plurality of the second slits included in the third slit group.

10. The manufacturing method according to claim 9, wherein the resistive layer is formed continuously and the first slit is formed by cutting the resistive layer formed continuously, or the first slit is formed by forming the resistive layer discontinuously at the first principal surface.

11. The manufacturing method according to claim 9, wherein the electrically conductive layer is formed continuously and the second slit is formed by cutting the electrically conductive layer formed continuously, or the second slit is formed by forming the electrically conductive layer discontinuously at the second principal surface.

* * * * *